United States Patent
Zhou et al.

(10) Patent No.: US 12,451,882 B2
(45) Date of Patent: Oct. 21, 2025

(54) DRIVING CIRCUIT

(71) Applicant: Delta Electronics (Shanghai) Co., Ltd., Shanghai (CN)

(72) Inventors: Weicheng Zhou, Shanghai (CN); Chongfeng Zheng, Shanghai (CN); Minghui Dai, Shanghai (CN); Min Zhou, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/680,559

(22) Filed: May 31, 2024

(65) Prior Publication Data
US 2024/0405766 A1    Dec. 5, 2024

(30) Foreign Application Priority Data
Jun. 2, 2023 (CN) .......................... 202310651225.2

(51) Int. Cl.
H03K 17/30 (2006.01)
H03K 17/06 (2006.01)
H03K 17/687 (2006.01)

(52) U.S. Cl.
CPC ......... H03K 17/302 (2013.01); H03K 17/063 (2013.01); H03K 17/687 (2013.01)

(58) Field of Classification Search
CPC ... H03K 17/302; H03K 17/063; H03K 17/687
USPC .................................................. 327/108–112
See application file for complete search history.

(56) References Cited

U.S. PATENT DOCUMENTS

2025/0149972 A1* 5/2025 Wang .................. H03K 17/163

FOREIGN PATENT DOCUMENTS

CN            112567612 A      3/2021

* cited by examiner

Primary Examiner — Tomi Skibinski
(74) Attorney, Agent, or Firm — KIRTON McCONKIE; Evan R. Witt

(57) ABSTRACT

A driving circuit for driving a switch element, which includes a control terminal, a first power terminal and a second power terminal. The second power terminal receives a first voltage. The driving circuit includes a switching circuit, a first unidirectional switch and a first capacitor. The switching circuit receives a first signal. The switching circuit is electrically connected with a first voltage terminal and a ground terminal. The first voltage terminal receives a second voltage. A voltage at the output terminal is switched between the second voltage and a ground voltage. A first terminal of the first unidirectional switch receives a third voltage. A first terminal of the first capacitor is connected with the output terminal of the switching circuit. A second terminal of the first capacitor is connected with a second terminal of the first unidirectional switch and the control terminal of the first switch element.

21 Claims, 12 Drawing Sheets

DRIVING CIRCUIT

CROSS-REFERENCE TO RELATED APPLICATION

This application claims priority to China Patent Application No. 202310651225.2, filed on Jun. 2, 2023, the entire contents of which are incorporated herein by reference for all purposes.

FIELD OF THE INVENTION

The present disclosure relates to a driving circuit, and more particularly to a driving circuit for controlling switch elements.

BACKGROUND OF THE INVENTION

Generally, switch elements are driven by a driving circuit. The switch element includes a control terminal, a first power terminal and a second power terminal. The second power terminal is usually connected to a stable ground (or a ground terminal). Consequently, the driving voltage provided from the driving circuit and received by the switch element is usually stable. The stable driving voltage here refers to that when the driving voltage is not zero, the fluctuation amplitude of the voltage is less than ±5% of the average value of the voltage. The stable ground here refers to that the voltage difference between the second power terminal and the ground terminal is less than ±5% of the threshold voltage.

However, in some switch elements, the second power terminal is connected to a floating voltage rather than the stable ground terminal. Since the floating voltage is unstable, the driving voltage received by the switch element at each time point is equal to the supply voltage from the driving circuit minus the floating voltage. If the supply voltage from the driving circuit is stable, the driving voltage in the high-voltage level state becomes unstable because of the floating voltage. Under this circumstance, the switching performance of the switch element is adversely affected, and the reliability of the switch element is reduced.

Therefore, it is important to provide an improved driving circuit in order to overcome the drawbacks of the conventional technologies.

SUMMARY OF THE INVENTION

An object of the present disclosure provides a driving circuit having a second power terminal of a switch element connected to a floating voltage for solving the problem that the driving voltage received by the control terminal of the switch element becomes unstable due to the floating voltage in the conventional driving circuit. Thereby, the switching performance of the switch element and the reliability of the switch element are enhanced.

In accordance with an aspect of the present disclosure, a driving circuit is provided. The driving circuit is electrically connected with at least one switch element to drive operations of the at least one switch element. Each of the at least one switch element includes a control terminal, a first power terminal and a second power terminal. The at least one switch element includes a first switch element. The second power terminal of the first switch element receives a first voltage. The driving circuit includes a switching circuit, a first unidirectional switch and a first capacitor. The switching circuit receives a first signal, wherein the switching circuit is electrically connected with a first voltage terminal and a ground terminal, and the switching circuit includes an output terminal, wherein the first signal is switched between a high-voltage level state and a low-voltage level state, the first voltage terminal receives a second voltage, and a voltage at the output terminal of the switching circuit is switched between the second voltage and a voltage at the ground terminal according to the first signal. The first unidirectional switch includes a first terminal and a second terminal, wherein the first terminal of the first unidirectional switch is electrically connected to a second voltage terminal to receive a third voltage. A first terminal of the first capacitor is electrically connected with the output terminal of the switching circuit, and a second terminal of the first capacitor is electrically connected with the second terminal of the first unidirectional switch and the control terminal of the first switch element. The first voltage is a floating voltage, a result of the second voltage plus the third voltage minus a sum of a conduction voltage of the first unidirectional switch and the first voltage is greater than a first threshold voltage of the first switch element. The first capacitor has a capacitance value, and the first capacitor has a charge during a charging-discharging process, wherein a ratio of the charge to the capacitance value satisfies an equation of:

$$\frac{Q_g}{C_{dd}} < \frac{V_1 + V_2 - V_{float}}{20},$$

wherein $Q_g$ is the charge, $C_{dd}$ is the capacitance value, $V_1$ is the second voltage, $V_2$ is the third voltage, and $V_{float}$ is the first voltage.

In accordance with an aspect of the present disclosure, a driving circuit is provided. The driving circuit is electrically connected with at least one switch element to drive operations of the at least one switch element. Each of the at least one switch element includes a control terminal, a first power terminal and a second power terminal. The at least one switch element includes a first switch element. The second power terminal of the first switch element receives a first voltage. The driving circuit includes a switching circuit, a first unidirectional switch and a first capacitor. The switching circuit receives a first signal. The switching circuit is electrically connected with a first voltage terminal and a ground terminal. The switching circuit includes an output terminal. The first signal is switched between a high-voltage level state and a low-voltage level state. The first voltage terminal receives a second voltage. A voltage at the output terminal of the switching circuit is switched between the second voltage and a voltage at the ground terminal according to the first signal. The first unidirectional switch includes a first terminal and a second terminal. The first terminal of the first unidirectional switch is electrically connected to a second voltage terminal to receive a third voltage. A first terminal of the first capacitor is electrically connected with the output terminal of the switching circuit. A second terminal of the first capacitor is electrically connected with the second terminal of the first unidirectional switch and the control terminal of the first switch element. The first voltage is a floating voltage. A result of the second voltage plus the third voltage minus a sum of a conduction voltage of the first unidirectional switch and the first voltage is greater than a first threshold voltage of the first switch element. The first threshold voltage of the first switch element is a stable voltage when the first signal is switched to the high-voltage level state or the low-voltage level state.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
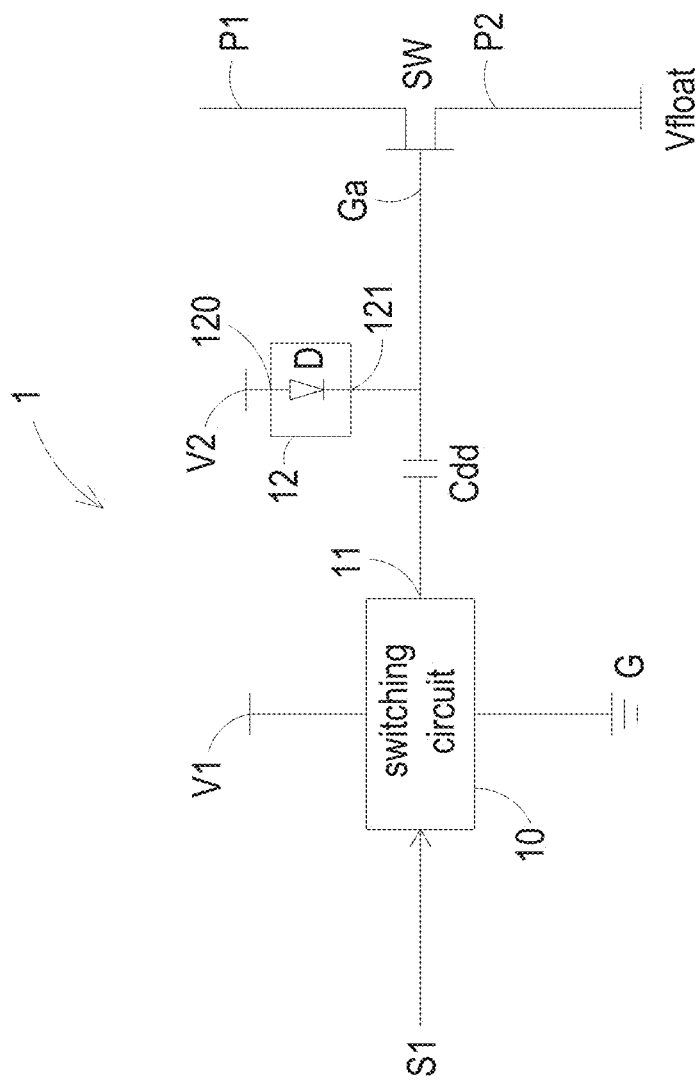
FIG. 1 is a schematic circuit diagram illustrating a driving circuit for driving a switch element according to a first embodiment of the present disclosure.

FIG. 1 is a schematic circuit diagram illustrating a driving circuit for driving a switch element according to a first embodiment of the present disclosure. In this embodiment, the driving circuit 1 is electrically connected with at least one switch element. For example, as shown in FIG. 1, the driving circuit 1 is electrically connected with a first switch element SW to drive the operations of the first switch element SW. Preferably but not exclusively, the first switch element SW is a metal-oxide-semiconductor field-effect transistor (MOSFET), an insulated gate bipolar transistor or a SiC power switch. The first switch element SW includes a control terminal Ga, a first power terminal P1 and a second power terminal P2. The second power terminal P2 is electrically connected with a floating terminal Vfloat. In addition, the second power terminal P2 receives a first voltage (i.e., a floating voltage) from the floating terminal Vfloat.

The driving circuit 1 includes a switching circuit 10, a first capacitor Cdd and a first unidirectional switch 12. The switching circuit 10 receives a first signal S1. In addition, the switching circuit 10 is electrically connected with a first voltage terminal V1 and a ground terminal G. The switching circuit 10 includes an output terminal 11. The first signal S1 is a signal that is switched between a high-voltage level state and a low-voltage level state. For example, the first signal S1 is a pulse width modulation (PWM) signal.

In an embodiment, the path between the first voltage terminal V1 and the output terminal 11 is conducted through the switching circuit 10 in response to the high-voltage level state of the first signal S1, and the path between the ground terminal G and the output terminal 11 is conducted through the switching circuit 10 in response to the low-voltage level state of the first signal S1. When the first signal S1 is in the high-voltage level state, the path between the first voltage terminal V1 and the output terminal 11 is conducted through the switching circuit 10, and the voltage at the output terminal 11 is equal to a second voltage at the first voltage terminal V1. When the first signal S1 is in the low-voltage level state, the path between the ground terminal G and the output terminal 11 is conducted through the switching circuit 10, and the voltage at the output terminal 11 is equal to zero. Preferably but not exclusively, the switching circuit 10 is a half-bridge circuit. It is noted that the control logic concept is not restricted. For example, in another embodiment, the path between the ground terminal G and the output terminal 11 is conducted through the switching circuit 10 in response to the high-voltage level state of the first signal S1, and the path between the first voltage terminal V1 and the output terminal 11 is conducted through the switching circuit 10 in response to the low-voltage level state of the first signal S1.

The first unidirectional switch 12 includes a first terminal 120 and a second terminal 121. The first terminal 120 is electrically connected with a second voltage terminal V2 and receives a third voltage from the second voltage terminal V2. The current is allowed to flow through the first unidirectional switch 12 in a single conduction direction. If the voltage difference between the first terminal 120 and the second terminal 121 of the first unidirectional switch 12 is greater than the conduction voltage of the first unidirectional switch 12, the first unidirectional switch 12 is turned on. The current flows in the conduction direction from the first terminal 120 to the second terminal 121. In an embodiment, the first unidirectional switch 12 includes a diode D. The anode of the diode D is served as the first terminal 120 of the first unidirectional switch 12. The cathode of the diode D is served as the second terminal 121 of the first unidirectional switch 12.

The first terminal of the first capacitor Cdd is electrically connected with the output terminal 11 of the switching circuit 10. The second terminal of the first capacitor Cdd is electrically connected with the second terminal 121 of the first unidirectional switch 12 and the control terminal Ga of the first switch element SW.

In an embodiment, the result of the second voltage plus the third voltage minus a sum of the first voltage and the conduction voltage of the first unidirectional switch 12 is greater than the first threshold voltage of the first switch element SW, and the result of the third voltage minus the sum of the first voltage and the conduction voltage of the first unidirectional switch 12 is less than the second threshold voltage of the first switch element SW. The first threshold voltage is the turning-on threshold voltage of the first switch device SW, and the second threshold voltage is the turning-off threshold voltage of the first switch device SW.

For some devices, the first threshold voltage is equal to the second threshold voltage. The above description is applicable to other embodiments in the disclosure. The first voltage is a floating voltage. The second voltage or the third voltage is equal to the first voltage. In this embodiment, the third voltage is equal to the first voltage. Moreover, the second voltage is a stable voltage. In the embodiment, the first capacitor Cdd has a capacitance value, and the first capacitor Cdd has a charge during a charging-discharging process, wherein a ratio of the charge to the capacitance value satisfies an equation of:

$$\frac{Q_g}{C_{dd}} < \frac{V_1 + V_2 - V_{float}}{20}$$

wherein $Q_g$ is the charge, $C_{dd}$ is the capacitance value, $V_1$ is the second voltage, $V_2$ is the third voltage, and $V_{float}$ is the first voltage.

Since the conduction voltage of the first unidirectional switch 12 is very low, the conduction voltage of the unidirectional switch 12 is hereinafter regarded as zero in order to illustrate the operating principles. Please refer to FIG. 1 again. When the first signal S1 is in the low-voltage level state, the path between the ground terminal G and the output terminal 11 is conducted through the switching circuit 10, and the voltage at the output terminal 11 is equal to zero. Under this circumstance, the third voltage charges the first capacitor Cdd through the first unidirectional switch 12. Meanwhile, the voltage at the second terminal of the first capacitor Cdd is the third voltage. That is, the voltage at the control terminal Ga of the first switch element SW is the third voltage, and the result of the third voltage minus the first voltage is less than the second threshold voltage. Since the voltage difference between the control terminal Ga and the second power terminal P2 of the first switch element SW is zero and less than the second threshold voltage, the first switch element SW is turned off. When the first signal S1 is in the high-voltage level state, the path between the first voltage terminal V1 and the output terminal 11 is conducted through the switching circuit 10, and the voltage at the output terminal 11 is equal to the second voltage at the first voltage terminal V1. Under this circumstance, the voltage at the second terminal of the first capacitor Cdd rises to the second voltage plus the third voltage. That is, the voltage at the control terminal Ga of the first switch element SW is equal to the second voltage plus the third voltage. Since the result of the second voltage plus the third voltage minus the first voltage is greater than the first threshold voltage of the first switch element SW, the first switch element SW is turned on. Moreover, since the third voltage is equal to the first voltage, the voltage difference between the control terminal Ga and the second power terminal P2 of the first switch element SW is equal to the second voltage. As mentioned above, the first voltage at the second power terminal P2 of the first switch element SW is the floating voltage. Under control of the driving circuit 1, the voltage difference between the control terminal Ga and the second power terminal P2 of the first switch element SW is equal to zero or the second voltage. Consequently, even if the first voltage is the floating voltage, the first switch element SW is not influenced by the first voltage. In other words, the switching performance and the reliability of the first switch element SW will be enhanced by the driving circuit 1.

Figure 2A:
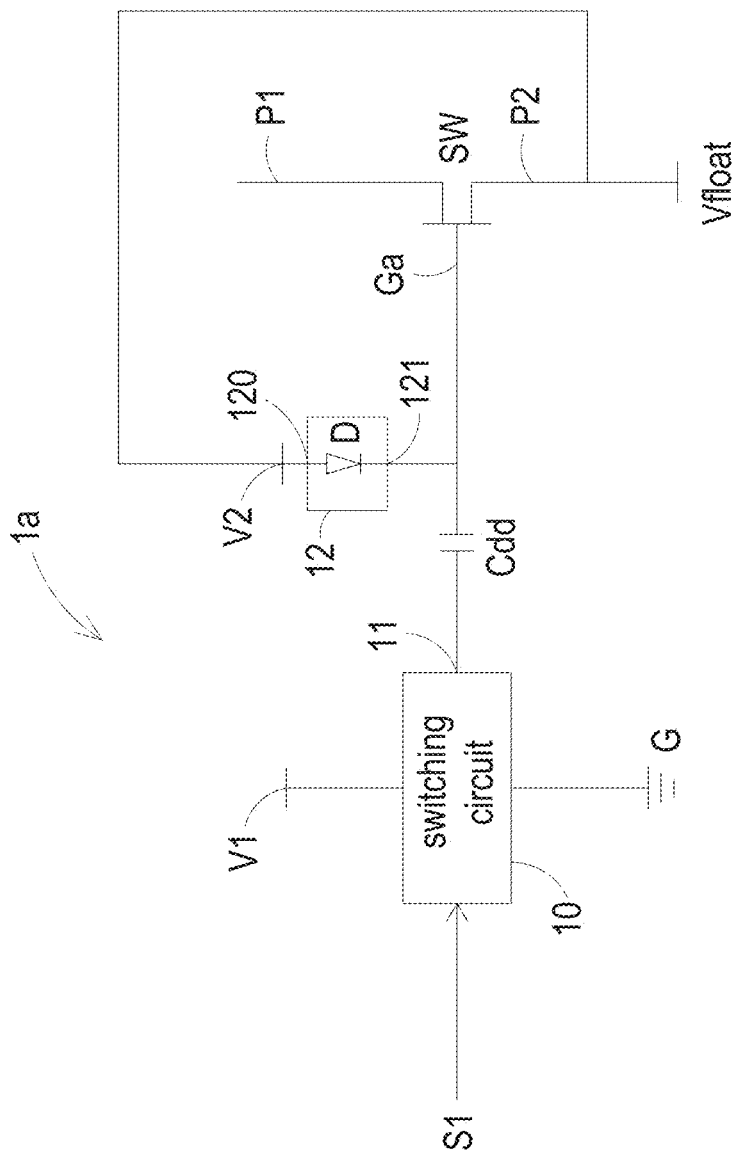
FIG. 2A is a schematic circuit diagram illustrating a driving circuit for driving a switch element according to a second embodiment of the present disclosure.
Figure 2B:
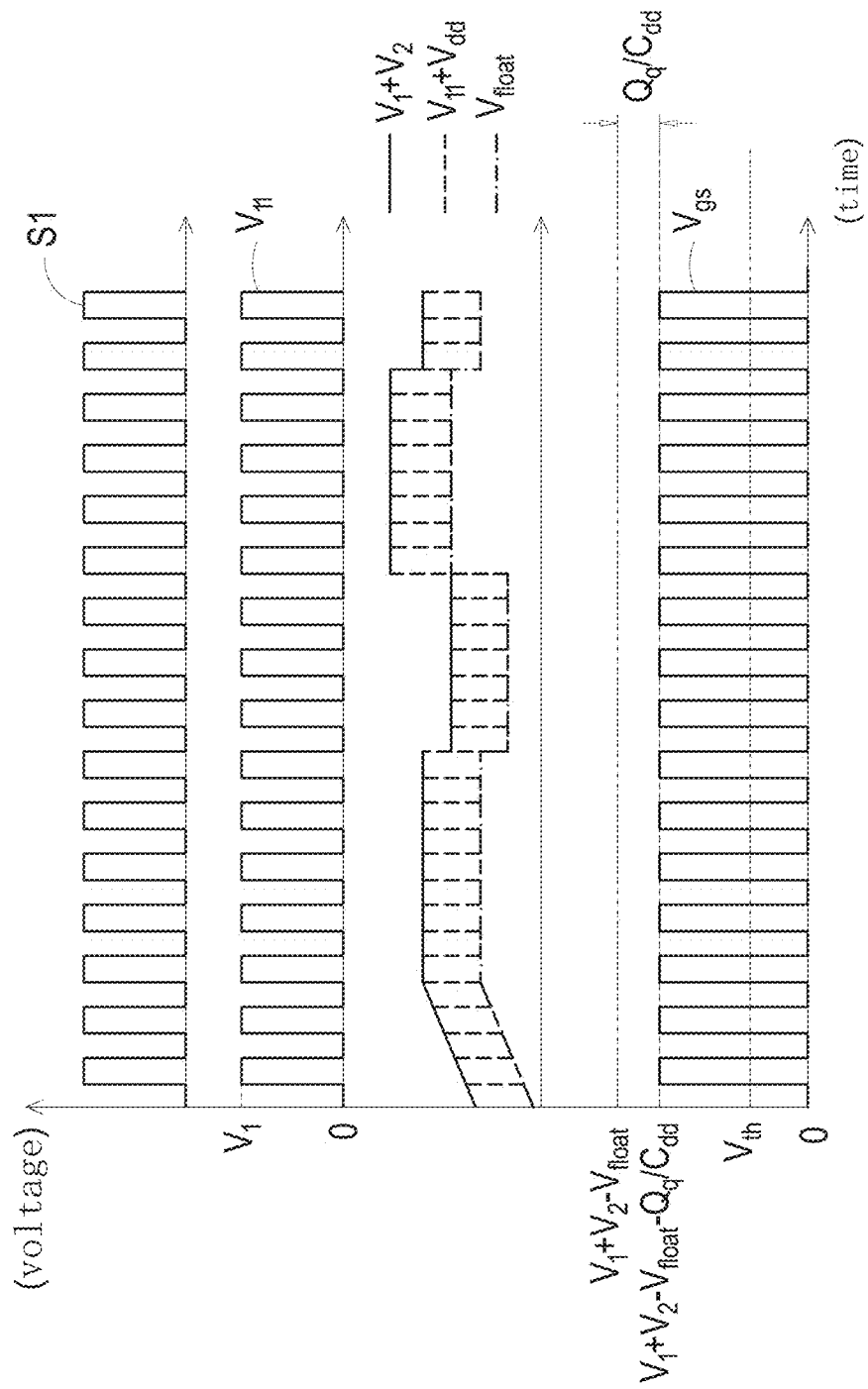
FIG. 2B is an operation timing diagram illustrating the driving circuit for driving the switch element in FIG. 2A.
Figure 2C:
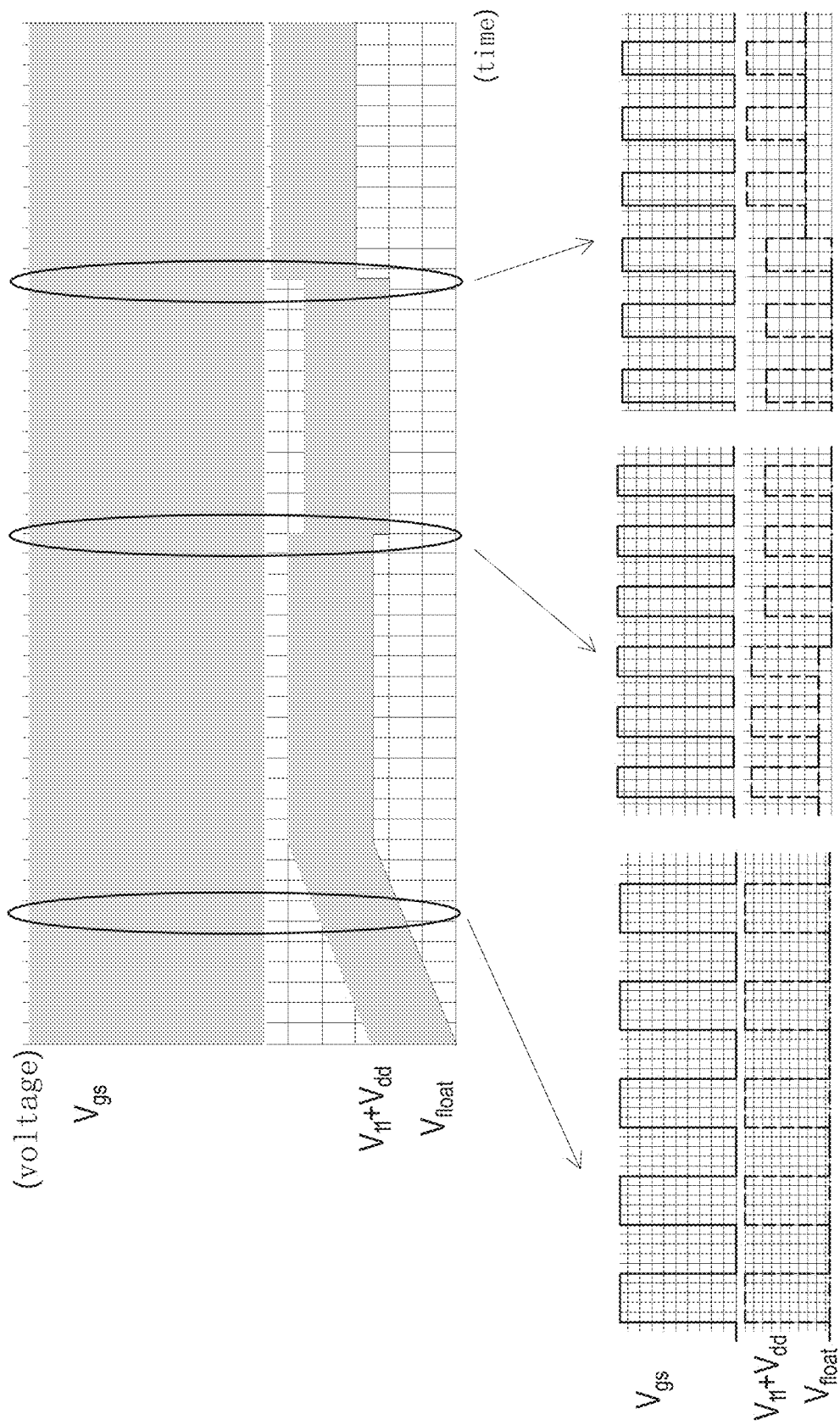
FIG. 2C is a schematic diagram of simulation results illustrating the driving circuit for driving the switch element in FIG. 2A.

Please refer to FIG. 2A, FIG. 2B and FIG. 2C. FIG. 2A is a schematic circuit diagram illustrating a driving circuit for driving a switch element according to a second embodiment of the present disclosure. FIG. 2B is an operation timing diagram illustrating the driving circuit for driving the switch element in FIG. 2A. FIG. 2C is a schematic diagram of simulation results illustrating the driving circuit for driving the switch element in FIG. 2A. Component parts and elements corresponding to those of the first embodiment are designated by identical numeral references, and detailed descriptions thereof are omitted. In comparison with the driving circuit 1 and the first switch element SW shown in FIG. 1, the second power terminal P2 of the first switch element SW in the embodiment is electrically connected to the floating terminal Vfloat for receiving the floating first voltage, and further electrically connected to the second voltage terminal V2. The third voltage is equal to the first voltage.

The first capacitor Cdd provides the first switch element SW with the power required for each control switch, so that each switching process is accompanied by a charging-discharging process. As shown in FIG. 2B and FIG. 2C, as the first signal S1 is switched between the high-voltage level state and the low-voltage level state, the capacitance voltage on the first capacitor Cdd is changed. The first signal S1 is switched from a low-voltage level state to a high-voltage level state (it can also be switched from a high-voltage level state to a low-voltage level state to indicate a change in its state), the voltage of a first terminal of the first capacitor Cdd relative to the ground is defined as a first ground-based voltage $V_{11}$, which is equal to the second voltage, and the voltage of a second terminal of the first capacitor Cdd relative to the ground is defined as a second ground-based voltage, which jumps to a voltage equal to the second voltage plus the third voltage. Since the first terminal 120 of the first unidirectional switch 12 is electrically connected to the second power terminal P2 of the first switch element SW, the third voltage is equal to the first voltage, so that the voltage of the second terminal of the first capacitor Cdd relative to the ground which is defined as the second ground-based voltage equals to the second voltage plus the first voltage. As a result, the control terminal Ga of the first switch element SW is charged, the gate-source voltage $V_{gs}$ of the first switch element SW is increased, and the first capacitor Cdd releases the energy at the same time to charge the control terminal Ga of the first switch element SW. The gate-source voltage $V_{gs}$ enters the steady high-voltage level state, and the voltage value is equal to the second voltage. When the first signal S1 is switched from the high-voltage level state to the low-voltage level state, the first ground-based voltage $V_{11}$ is equal to 0V. The control terminal Ga of the first switch element SW is discharged, and the gate-source voltage $V_{gs}$ is decreased. At the same time, the first capacitor Cdd is charged by the first voltage through the first unidirectional switch 12. The gate-source voltage $V_{gs}$ enters the steady low-voltage level state.

In the above charging-discharging process, the first capacitor Cdd has a charge $Q_g$. Therefore, the peak-to-peak voltage ripple generated by the voltage drop Vdd between two terminals of the first capacitor Cdd is expressed $Q_g/C_{dd}$. $C_{dd}$ is the capacitance value of the first capacitor $C_{dd}$. The voltage of the gate-source voltage $V_{gs}$ in the steady high-voltage level state is equal to the second voltage minus the peak-to-peak voltage ripple ($Q_g/C_{dd}$). Moreover, the voltage of the gate-source voltage $V_{gs}$ in the low-voltage level state is equal to the third voltage minus the first voltage, which is zero. Reliable turn-off of the first switch element SW can be ensured. In addition, since the second voltage is a constant, the second voltage plus the third voltage minus the first voltage is a constant. In order to ensure that the first switch element SW can be well turned on when the gate-source voltage $V_{gs}$ is in the high-voltage level state, the gate-source voltage $V_{gs}$ of the control terminal Ga of the first switch element SW needs to be stable. It needs to satisfy an equation of:

$$\frac{Q_g}{C_{dd}} < \frac{V_1 + V_2 - V_{float}}{20},$$

wherein $Q_g$ is the charge, $C_{dd}$ is the capacitance value, $V_1$ is the second voltage, $V_2$ is the third voltage, and $V_{float}$ is the first voltage.

Please refer to FIG. 2B. The first waveform represents the first signal S1, the second waveform is the first ground-based voltage $V_{11}$, and the third waveform includes three lines. The first line (i.e., the continuous line) in the third waveform represents $V_1+V_2$, which is also equal to the second voltage plus the third voltage. The second line (i.e., short-dashed line) in the third waveform represents the second ground-based voltage. When the first signal S1 is in the high-voltage level state, the second ground-based voltage equals to the second voltage plus the first voltage ($V_{float}$). When the first signal S1 is in the low-voltage level state, the second ground-based voltage is equal to the first voltage. Since the first voltage is floating, the second ground-based voltage is changed with the first voltage. The third line (i.e., the chain line) in the third waveform represents the first voltage ($V_{float}$). The fourth waveform is the gate-source voltage $V_{gs}$. The voltage of the gate-source voltage $V_{gs}$ in the high-voltage level state is equal to the second voltage plus the third voltage minus the first voltage and minus the ratio of the charge to the capacitance value (i.e. $V_1+V_2-V_{float}-Q_g/C_{dd}$). That is, the second voltage minus the ratio of the charge to the capacitance value (i.e., $V_1-Q_g/C_{dd}$)). The voltage of the gate-source voltage $V_{gs}$ in the low-voltage level state is equal to the third voltage minus the first voltage ($V_2-V_{float}$), which is equal to 0. The $V_{th}$ marked in FIG. 2B is the threshold voltage of the first switch element SW.

In addition, as shown in FIG. 2C, the driving circuit 1a of this embodiment can enable the sum of the second voltage and the third voltage to follow the change of the first voltage, so that the threshold voltage of the first switch element SW in the high-voltage level state or the low-voltage level state is a stable voltage. The stable voltage here refers to that when the voltage between the control terminal Ga and the second power terminal P2 of the first switch element SW is in the high-voltage level state, the fluctuation amplitude of the voltage between the control terminal Ga and the second power terminal P2 of the first switch element SW is less than ±5% of the average value in the high level voltage; when the voltage between the control terminal Ga and the second power terminal P2 of the first switch element SW is in the low-voltage level state, the fluctuation amplitude of the voltage between the control terminal Ga and the second power terminal P2 of the first switch element SW is less than ±5% of the threshold voltage value of the first switch element SW.

Figure 3:
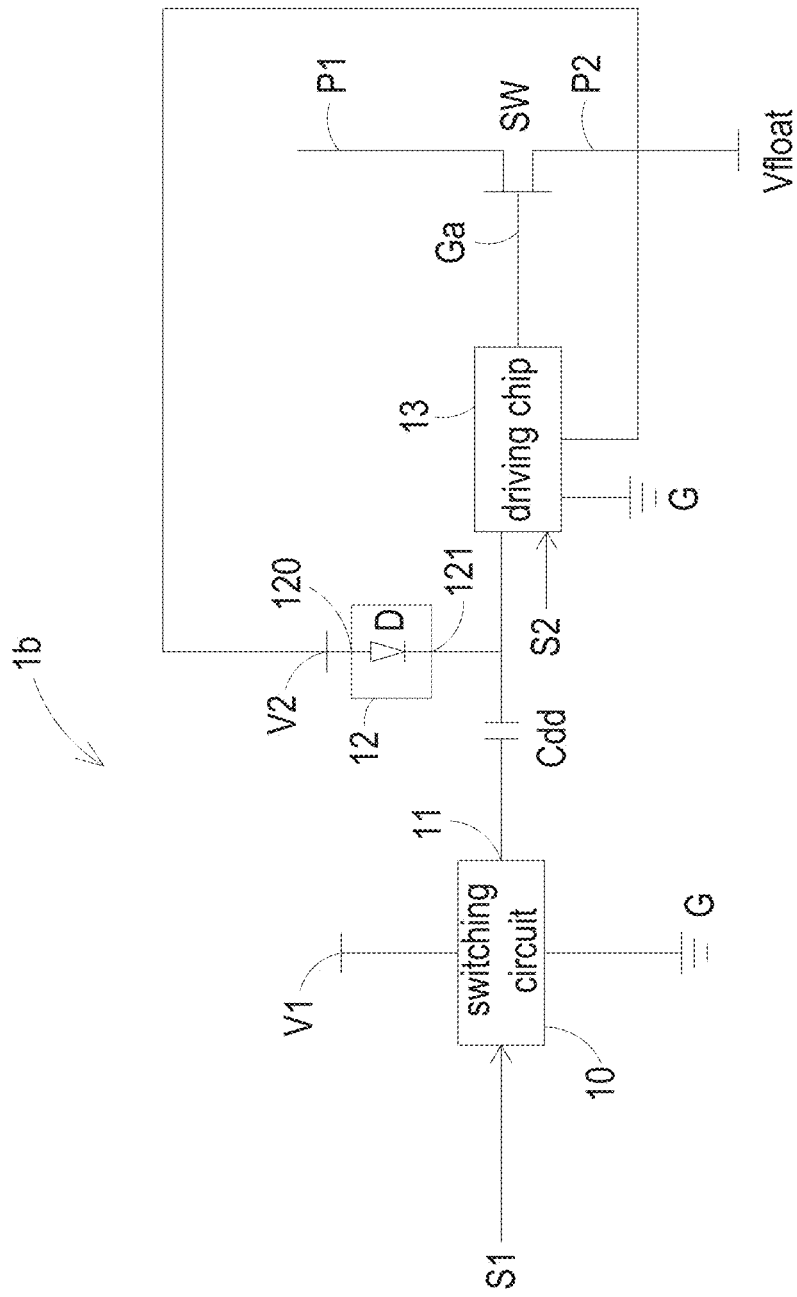
FIG. 3 is a schematic circuit diagram illustrating a driving circuit for driving a switch element according to a third embodiment of the present disclosure.

Please refer to FIG. 3. It is a schematic circuit diagram illustrating a driving circuit for driving a switch element according to a third embodiment of the present disclosure. In the third embodiment, the structures, elements and functions of the driving circuit 1b are similar to those of the driving circuit 1a of FIG. 2A, and are not redundantly described herein. In comparison with the driving circuit 1a shown in FIG. 2A, the driving circuit 1b of this embodiment further includes a driving chip 13. A power supply terminal of the driving chip 13 is electrically connected with the second terminal of the first capacitor Cdd and the second terminal 121 of the first unidirectional switch 12. An output terminal of the driving chip 13 is electrically connected to the control terminal Ga of the first switch element SW. An output ground terminal of the driving chip 13 is electrically connected to the second power terminal P2 of the first switch element SW. A signal ground terminal of the driving chip 13 is electrically connected to the ground terminal G, and a signal terminal of the driving chip 13 receives a second signal S2. The second signal S2 is a signal that is switched between a high-voltage level state and a low-voltage level state. For example, the second signal S2 is a pulse width modulation (PWM) signal. The second signal S2 is synchronized with the first signal S1. When the second signal S2 is in the high-voltage level state, the voltage at the control terminal Ga of the first switch element SW is equal to the voltage at the second terminal of the first capacitor Cdd. When the second signal S2 is in the low-voltage level state, the voltage at the control terminal Ga of the first switch element SW is equal to the first voltage at the floating terminal Vfloat.

When the first signal S1 and the second signal S2 are both in the low-voltage level state, the path between the ground terminal G and the output terminal 11 is conducted through the switching circuit 10, and the voltage at the output terminal 11 is equal to zero. Under this circumstance, the third voltage charges the first capacitor Cdd through the first unidirectional switch 12. Meanwhile, the voltage at the second terminal of the first capacitor Cdd equals the third voltage. Moreover, since the second signal S2 is in the low-voltage level state, the voltage at the control terminal Ga of the first switch element SW is equal to the first voltage at the floating terminal Vfloat. Since the voltage difference between the control terminal Ga and the second power terminal P2 of the first switch element SW is zero and less than the second threshold voltage, the first switch element SW is turned off.

When the first signal S1 and the second signal S2 are both in the high-voltage level state, the path between the first voltage terminal V1 and the output terminal 11 is conducted through the switching circuit 10, and the voltage at the output terminal 11 is equal to the second voltage at the first voltage terminal V1. Under this circumstance, the voltage at the second terminal the first capacitor Cdd rises to the second voltage plus the third voltage. That is, the voltage at the control terminal Ga of the first switch element SW is equal to the second voltage plus the third voltage. Since the result of the second voltage plus the third voltage minus the first voltage is greater than the first threshold voltage of the first switch element SW, the first switch element SW is turned on. Moreover, since the third voltage is equal to the first voltage, the voltage difference between the control terminal Ga and the second power terminal P2 of the first switch element SW is equal to the second voltage. The second voltage needs to be higher than the first threshold voltage of the first switch element SW, so that the first switch element SW can be stably and effectively turned on. As mentioned above, the first voltage at the second power terminal P2 of the first switch element SW is the floating voltage. Under control of the driving circuit 1b, the voltage difference between the control terminal Ga and the second power terminal P2 of the first switch element SW is equal to zero or the second voltage. Consequently, even if the first voltage is the floating voltage, the first switch element SW is not influenced by the first voltage. In other words, the switching performance and the reliability of the first switch element SW will be enhanced by the driving circuit 1b. In addition, in order to prevent the first voltage from charging the first capacitor Cdd through the driving chip 13, the sum of the first voltage and the conduction voltage of the first unidirectional switch 12 minus the third voltage is less than 0.7V.

Figure 4A:
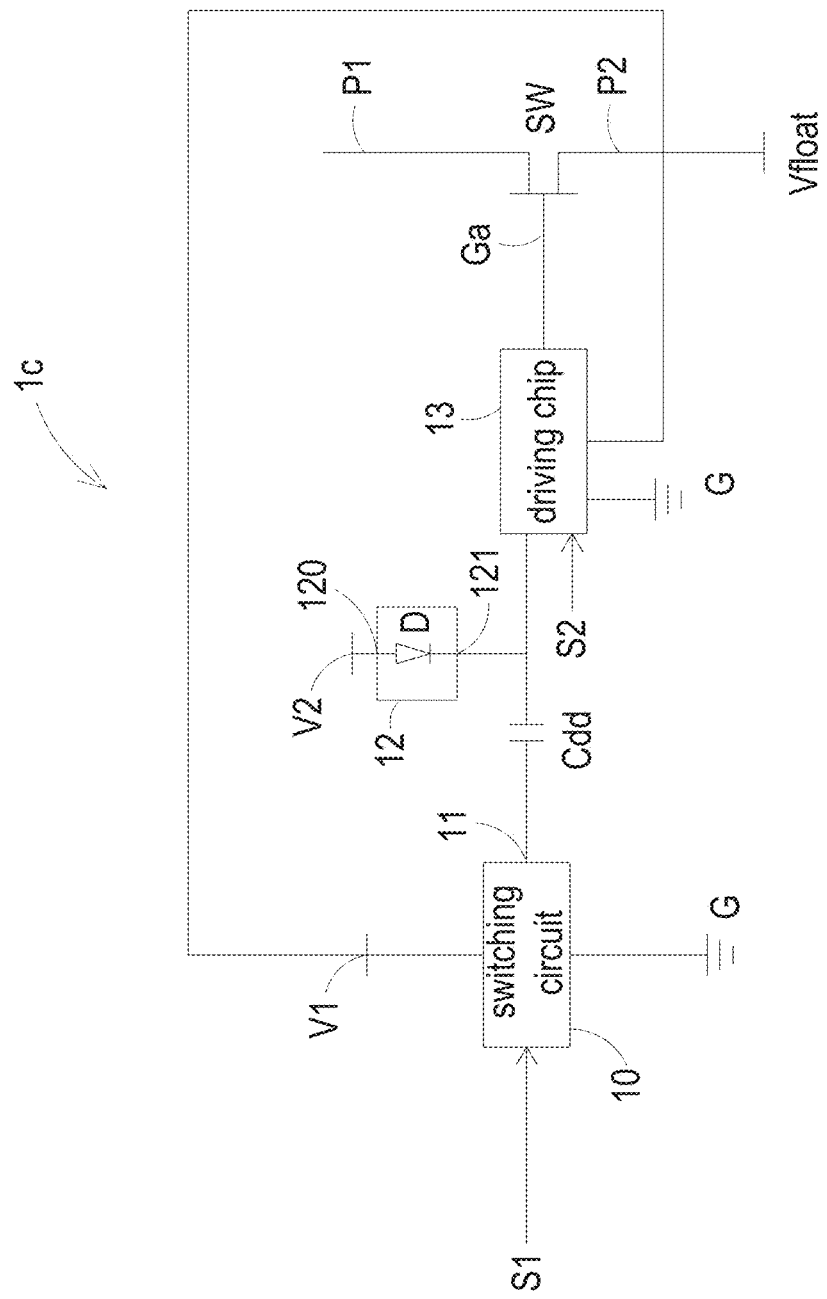
FIG. 4A is a schematic circuit diagram illustrating a driving circuit for driving a switch element according to a fourth embodiment of the present disclosure.
Figure 4B:
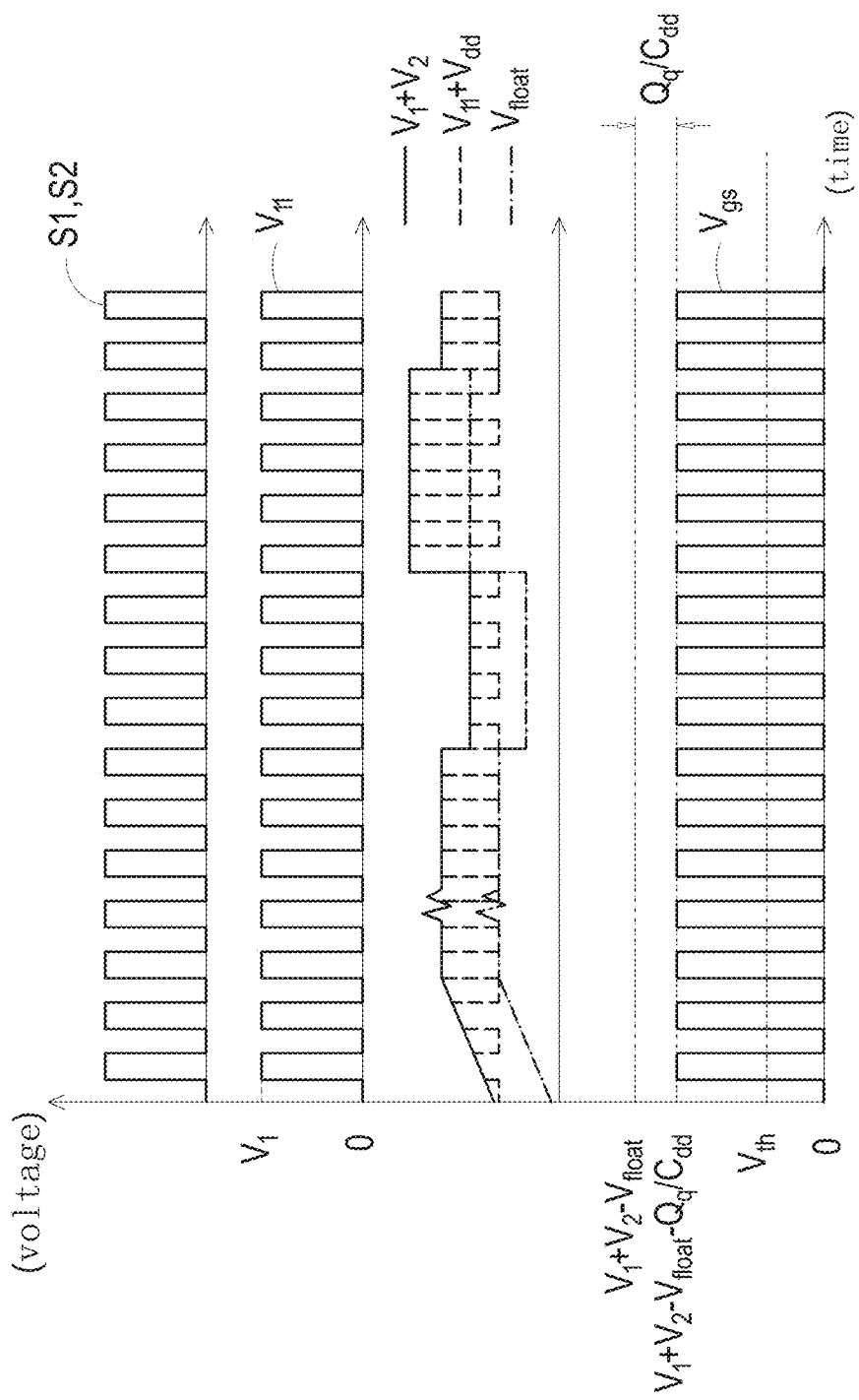
FIG. 4B is an operation timing diagram illustrating the driving circuit for driving the switch element in FIG. 4A.

Please refer to FIG. 4A and FIG. 4B. FIG. 4A is a schematic circuit diagram illustrating a driving circuit for driving a switch element according to a fourth embodiment of the present disclosure. FIG. 4B is an operation timing diagram illustrating the driving circuit for driving the switch element in FIG. 4A. In the embodiment, the structures, elements and functions of the driving circuit 1c are similar to those of the driving circuit 1b of FIG. 3, and are not redundantly described herein. In comparison with the second power terminal P2 of the first switch element SW electrically connected to the second voltage terminal V2 in FIG. 3, the second power terminal P2 of the first switch element SW in this embodiment is no longer electrically connected to the second voltage terminal V2, but is electrically connected to the first voltage terminal V1. Therefore, the second voltage is equal to the first voltage.

In the embodiment, the voltage drop between the control terminal Ga and the second power terminal P2 of the first switch element SW in the high-voltage level state is equal to the sum of the second voltage and the third voltage minus the first voltage, and the voltage drop thereof in the low-voltage level state is equal to 0. Moreover, since the first voltage terminal V1 and the second power terminal P2 are electrically connected directly, so that the second voltage is equal to the first voltage. The voltage drop between the control terminal Ga and the second power terminal P2 of the first switch element SW in the high-voltage level state is equal to the third voltage. In this way, as long as the third voltage is ensured to be greater than the first threshold voltage of the first switch element SW, the control terminal Ga of the first switch element SW can be operated in two stable voltage levels of 0V and the third voltage. Similarly, in order to prevent the first voltage from charging the first capacitor Cdd through the driving chip 13, the sum of the first voltage and the conduction voltage of the first unidirectional switch 12 minus the third voltage is less than 0.7 V.

In the embodiment shown in FIG. 2A and FIG. 3, since the first unidirectional switch 12 is turned off and not conducted when the output terminal 11 and the first voltage terminal V1 are short-circuited, the voltage drop across two terminals of the first capacitor Cdd fails to follow the first voltage during this period. It can only guarantee the effective following of the first voltage at a lower frequency relative to the switching frequency. On the other hand, the advantage of this embodiment is that the second voltage is equal to the first voltage in real time. It allows the second voltage to follow the change of the first voltage, so as to achieve the effective tracking under high-frequency fluctuations of the first voltage.

Please refer to FIG. 4B. The first waveform represents the first signal S1, the second waveform is the first ground-based voltage $V_{11}$, and the third waveform includes three lines. The first line (i.e., the continuous line) in the third waveform represents $V_1+V_2$, which is also equal to the second voltage plus the third voltage. The second line (i.e., the short-dashed line) in the third waveform represents the second ground-based voltage. When the first signal S1 is in the high-voltage level state, the second ground-based voltage is the second voltage plus the third voltage. Since the first voltage terminal V1 and the second power terminal P2 are electrically connected directly, the second voltage is equal to the first voltage ($V_{float}$). When the first signal S1 is in the low-voltage level state, the second ground-based voltage is equal to the third voltage. Since the first voltage is floating, the second ground-based voltage is changed with the first voltage. The third line (i.e., the chain line) in the third waveform represents the first voltage ($V_{float}$). The fourth waveform is the gate-source voltage $V_{gs}$. The voltage of the gate-source voltage $V_{gs}$ in the high-voltage level state is equal to the second voltage plus the third voltage minus the first voltage and minus the ratio of the charge to the capacitance value (i.e. $V_1+V_2-V_{float}-Q_g/C_{dd}$). That is, the third voltage minus the ratio of the charge to the capacitance value (i.e., $V_1-Q_g/C_{dd}$)). The voltage of the gate-source voltage $V_{gs}$ in the low-voltage level state is equal to 0.

Figure 5:
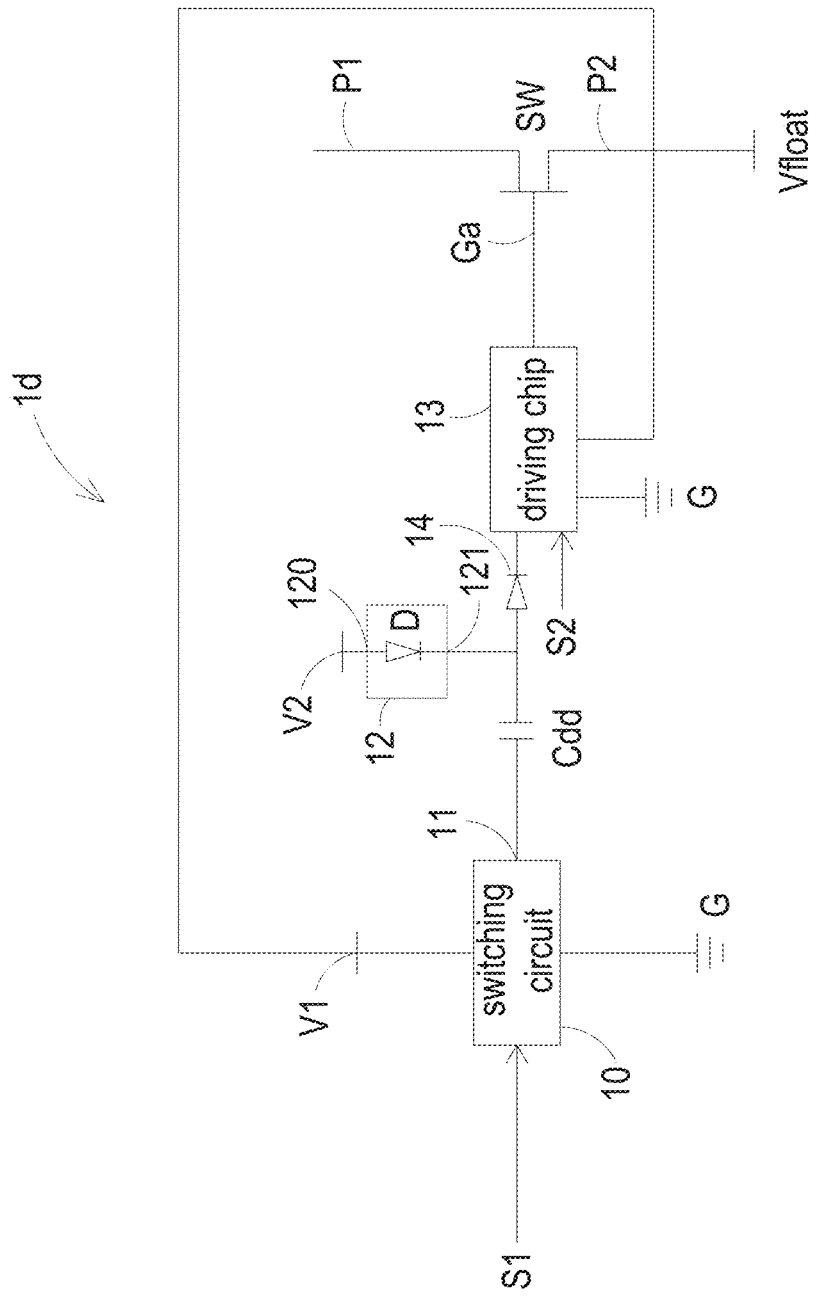
FIG. 5 is a schematic circuit diagram illustrating a driving circuit for driving a switch element according to a fifth embodiment of the present disclosure.

Please refer to FIG. 5. It is a schematic circuit diagram illustrating a driving circuit for driving a switch element according to a fifth embodiment of the present disclosure. In the embodiment, the structures, elements and functions of the driving circuit 1d are similar to those of the driving circuit 1c of FIG. 4, and are not redundantly described herein. In comparison with the driving circuit 1c shown in FIG. 3, the driving circuit 1d of this embodiment further includes a second unidirectional switch 14. The second unidirectional switch 14 includes a first terminal and a second terminal. The first terminal of the second unidirectional switch 14 is electrically connected with the first terminal of the first capacitor Cdd and the second terminal 121 of the first unidirectional switch 12. The second terminal of the second unidirectional switch 14 is electrically connected with the power supply terminal of the driving chip 13. When the voltage between the first terminal and the second terminal of the second unidirectional switch 14 is greater than the conduction voltage of the second unidirectional switch 14, the second unidirectional switch 14 is turned on, and the conduction direction is from the first terminal of the second unidirectional switch 14 to the second terminal. Preferably but not exclusively, in some embodiments, the second unidirectional switch 14 is a second diode. An anode of the second diode is the first terminal of the second unidirectional switch 14, and a cathode of the second diode is the second terminal of the second unidirectional switch 14.

The basic working principle of the driving circuit 1d of this embodiment is similar to that of the driving circuit 1c shown in FIG. 4A, and not redundantly described herein. The function of the second unidirectional switch 14 is explained as the following. In the driving circuit 1c shown in FIG. 4A, when the first signal S1 and the second signal S2 are in the low-voltage level state, respectively, the output terminal 11 is connected to the ground terminal G. Moreover, the second terminal of the first capacitor Cdd and the second terminal 121 of the first unidirectional switch 12 have the ground voltage equal to the third voltage. The output terminal of the driver chip 13 and the control terminal Ga of the first switch element SW have the ground voltage equal to the first voltage. If the first voltage exceeds the result of the third voltage minus the conduction voltage of the first unidirectional switch 12 due to fluctuation, it may happen that the first voltage directly charges the first capacitor Cdd through the driving chip 13. It is charged from the stable third voltage to the fluctuation peak of the first voltage, and the stable condition that the third voltage is constant is destroyed. This results in subsequent instability due to inconsistent switching voltage levels. In this embodiment, the second unidirectional switch 14 can function when the first signal S1 and the second signal S2 are in the low-voltage level state respectively and the first voltage is greater than the third voltage. The charging circuit of the first voltage directly to the first capacitor Cdd is blocked, so that the voltage level of the first capacitor Cdd during this period is always maintained at the stable third voltage. This ensures that the high and low voltage levels between the control terminal Ga of the first switch element SW and the second power terminal P2 of the first switch element SW are respectively stable during each subsequent switching process.

Figure 6A:
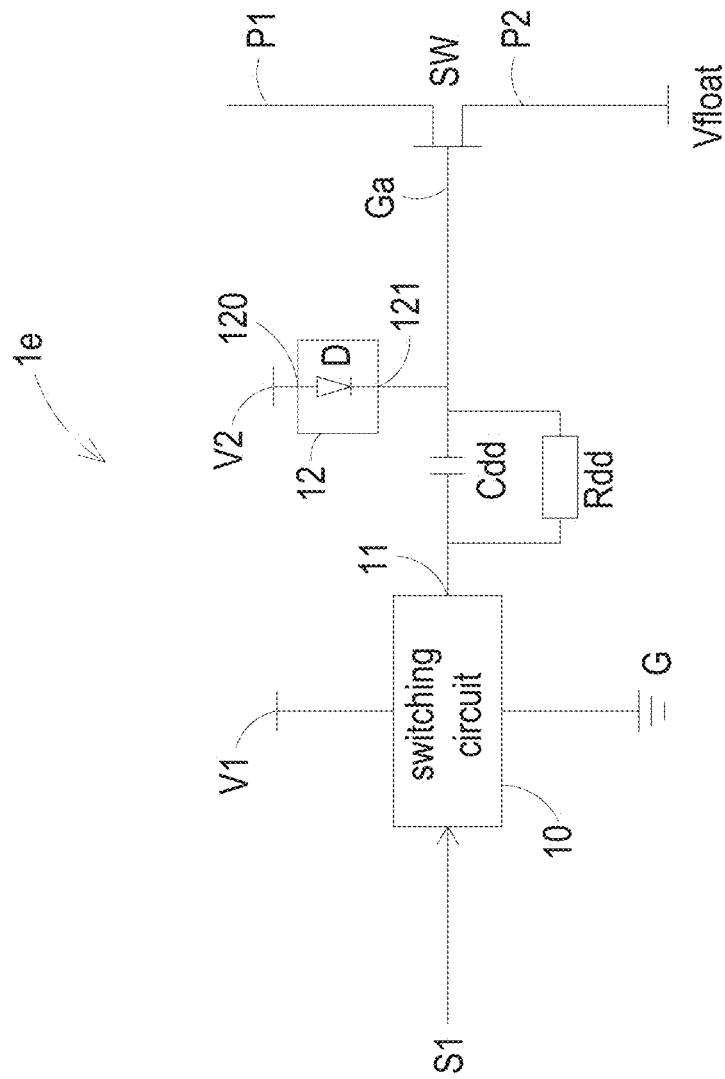
FIG. 6A is a schematic circuit diagram illustrating a driving circuit for driving a switch element according to a sixth embodiment of the present disclosure.
Figure 6B:
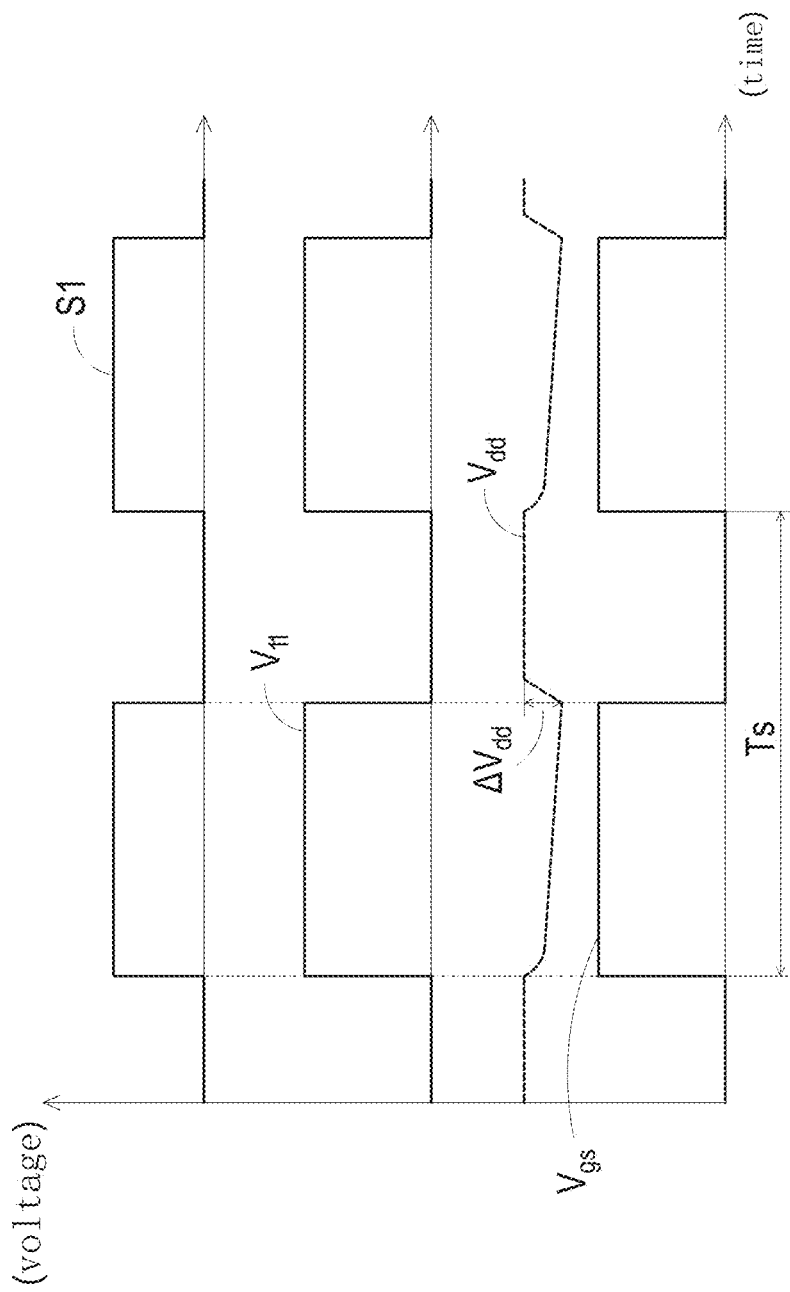
FIG. 6B is an operation timing diagram illustrating the driving circuit for driving the switch element in FIG. 6A.

Please refer to FIG. 6A and FIG. 6B. FIG. 6A is a schematic circuit diagram illustrating a driving circuit for driving a switch element according to a sixth embodiment of the present disclosure. FIG. 6B is an operation timing diagram illustrating the driving circuit for driving the switch element in FIG. 6A. In the embodiment, the structures, elements and functions of the driving circuit 1e are similar to those of the driving circuit 1 of FIG. 1, and are not redundantly described herein. In comparison with the driving circuit 1 shown in FIG. 1, the driving circuit 1e of this embodiment further includes a resistor Rdd, and the resistor Rdd is electrically connected in parallel with the first capacitor Cdd.

In the driving circuit 1 shown in FIG. 1, the second terminal of the first capacitor Cdd is connected to the second terminal 121 of the first unidirectional switch 12 and the control terminal Ga of the first switch element SW. Neither of them can provide an effective and faster discharging circuit for the first capacitor Cdd. Therefore, the first capacitor Cdd can be charged for a long time after the entire driving circuit 1 is powered off. If the electricity on the first capacitor Cdd is not completely discharged and the driving circuit 1 is charged and restarted, it is likely that the first switch element SW may be accidentally turned on, resulting in damage. However, the resistor Rdd in this embodiment can effectively discharge the first capacitor Cdd, thereby avoiding the above situation.

The value of the resistor Rdd cannot be too small, otherwise the voltage on the first capacitor Cdd will be rapidly discharged and unstable during the switching process. It causes the control voltage level of the first switch element SW to be unstable. Therefore, the first capacitor Rdd needs to satisfy an equation of: $R_{dd} \times C_{dd} > 50\, T_s$, wherein $R_{dd}$ is the resistance value of the first capacitor Rdd, $C_{dd}$ is the capacitance value of the first capacitor Cdd, and $T_s$ is the switching period of the first switch element SW.

Please refer to FIG. 6B. The first waveform represents the first signal S1, and the second waveform is the first ground-based voltage $V_{11}$. The short-dashed line in the third waveform represents the voltage drop $V_{dd}$ across the first capacitor Cdd and the gate-source voltage $V_{gs}$. The fluctuation $\Delta V_{dd}$ of voltage drop $V_{dd}$ is small. Certainly, the resistor Rdd in this embodiment can also be applied in each embodiment of the driving circuit mentioned in the present disclosure.

Figure 7:
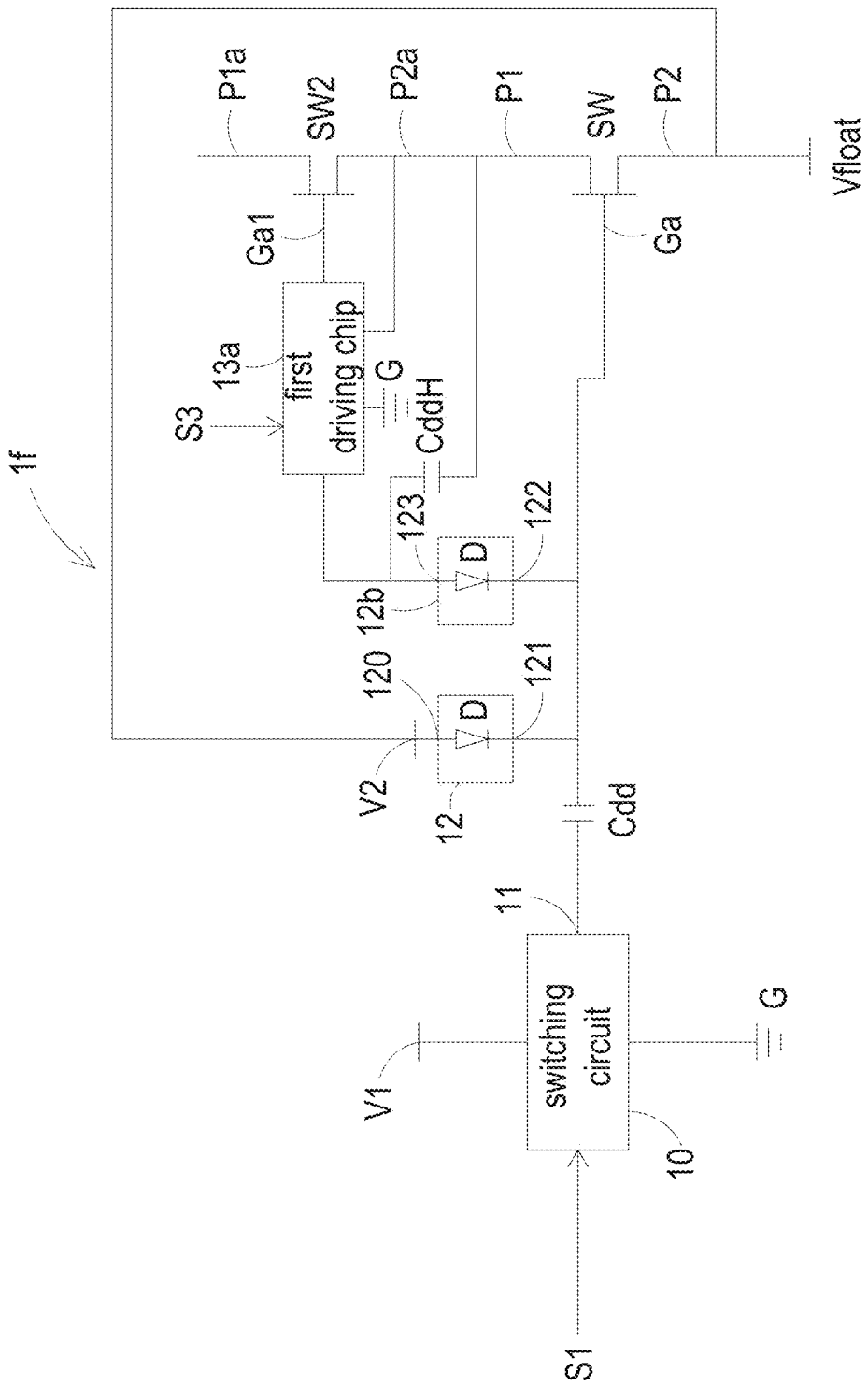
FIG. 7 is a schematic circuit diagram illustrating a driving circuit for driving a switch element according to a seventh embodiment of the present disclosure.

Please refer to FIG. 7, which is a schematic circuit diagram illustrating a driving circuit for driving a switch element according to a seventh embodiment of the present disclosure. In this embodiment, the driving circuit 1f is electrically connected with two switch elements. For example, as shown in FIG. 7, the driving circuit 1f is electrically connected with a first switch element SW and a second switch element SW2 to drive the operations of the first switch element SW and the second switch element SW2. Preferably but not exclusively, the first switch element SW and the second switch element SW2 are metal-oxide-semiconductor field-effect transistors (MOSFETs). The first switch element SW and the second switch element SW2 are connected with each other in series and collaboratively formed as a half-bridge switching circuit. The first switch element SW includes a control terminal Ga, a first power terminal P1 and a second power terminal P2. The second power terminal P2 is electrically connected with a floating terminal Vfloat. In addition, the second power terminal P2 receives a first voltage (i.e., a floating voltage) from the floating terminal Vfloat. Moreover, the second power terminal P2 of the first switch element SW is further electrically connected to the second voltage terminal V2 to receive the third voltage transmitted from the second voltage terminal V2. Therefore, the third voltage is equal to the first voltage. The second switch element SW2 includes a control terminal Ga1, a first power terminal P1a and a second power terminal P2a. The second power terminal P2a of the second switch element SW2 is electrically connected with the first power terminal P1 of the first switch element SW.

The driving circuit 1f includes a switching circuit 10, a first capacitor Cdd, a first unidirectional switch 12, a second unidirectional switch 12b, a second capacitor CddH and a first driving chip 13a. The switching circuit 10 receives a first signal S1. In addition, the switching circuit 10 is electrically connected with a first voltage terminal V1 and a ground terminal G. The switching circuit 10 includes an output terminal 11. The first signal S1 is a signal that is switched between a high-voltage level state and a low-voltage level state. For example, the first signal S1 is a pulse width modulation (PWM) signal. When the first signal S1 is in the high-voltage level state, the path between the first voltage terminal V1 and the output terminal 11 is conducted through the switching circuit 10, and the voltage at the output terminal 11 is equal to a second voltage at the first voltage terminal V1. When the first signal S1 is in the low-voltage level state, the path between the ground terminal G and the output terminal 11 is conducted through the switching circuit 10, and the voltage at the output terminal 11 is equal to zero.

The first unidirectional switch 12 includes a first terminal 120 and a second terminal 121. The first terminal 120 is electrically connected with a second voltage terminal V2 and receives a third voltage from the second voltage terminal V2. The current is allowed to flow through the first unidirectional switch 12 in a single conduction direction. If the voltage difference between the first terminal 120 and the second terminal 121 of the first unidirectional switch 12 is greater than the conduction voltage of the first unidirectional switch 12, the first unidirectional switch 12 is turned on. The current flows in the conduction direction from the first terminal 120 to the second terminal 121. The second unidirectional switch 12b includes a first terminal 122 and a second terminal 123. The current is allowed to flow through the second unidirectional switch 12b in a single conduction direction. If the voltage difference between the first terminal 122 and the second terminal 123 of the second unidirectional switch 12b is greater than the conduction voltage of the second unidirectional switch 12b, the second unidirectional switch 12b is turned on. The current flows in the conduction direction from the first terminal 122 to the second terminal 123. In an embodiment, each of the first unidirectional switch 12 and the second unidirectional switch 12b includes a diode D. The anode of the diode D of the first unidirectional switch 12 is served as the first terminal 120 of the first unidirectional switch 12. The cathode of the diode D of the first unidirectional switch 12 is served as the second terminal 121 of the first unidirectional switch 12. The anode of the diode D of the second unidirectional switch 12*b* is served as the first terminal 122 of the second unidirectional switch 12*b*. The cathode of the diode D of the second unidirectional switch 12*b* is served as the second terminal 123 of the second unidirectional switch 12*b*.

The first terminal of the first capacitor Cdd is electrically connected with the output terminal 11 of the switching circuit 10. The second terminal of the first capacitor Cdd is electrically connected with the second terminal 121 of the first unidirectional switch 12, the first terminal 122 of the second unidirectional switch 12*b* and the control terminal Ga of the first switch element SW.

The first terminal of the second capacitor CddH is electrically connected with the second terminal 123 of the second unidirectional switch 12*b* and the power supply terminal of the first driving chip 13*a*. The second terminal of the second capacitor CddH is electrically connected with the first power terminal P1 of the first switch element SW and the second power terminal P2*a* of the second switch element SW2.

The power supply terminal of the first driving chip 13*a* is electrically connected with the first terminal of the second capacitor CddH and the second terminal 123 of the second unidirectional switch 12*b*. The output terminal of the first driving chip 13*a* is electrically connected with the control terminal Ga1 of the second switch element SW2. The output ground terminal of the first driving chip 13*a* is electrically connected with the second power terminal P2*a* of the second switch element SW2, the second terminal of the second capacitor CddH and the first power terminal P1 of the first switch element S2. The signal ground terminal of the first driving chip 13*a* is electrically connected with the ground terminal. Moreover, the signal terminal of the first driving chip 13*a* further receives a third signal S3. The third signal S3 is a signal that is switched between a high-voltage level state and a low-voltage level state. For example, the third signal S3 is a pulse width modulation (PWM) signal. When the third signal S3 is in the high-voltage level state, the voltage at the control terminal Ga1 of the second switch element SW2 is equal to the voltage at the first terminal of the second capacitor CddH. When the third signal S3 is in the low-voltage level state, the voltage at the control terminal Ga1 of the second switch element SW2 is equal to the voltage at the second power terminal P2*a* of the second switch element SW2, and the third signal S3 and the first signal S1 are complementary.

In some embodiments, the result of the second voltage plus the third voltage minus the sum of the conduction voltage of the first unidirectional switch 12 and the first voltage is greater than the first threshold voltage of the first switch element SW, and the result of the third voltage minus the sum of the first voltage and the conduction voltage of the first unidirectional switch 12 is less than the second threshold voltage of the first switch element SW. Similarly, the result of the second voltage plus the third voltage minus the sum of the conduction voltage of the second unidirectional switch 12*b*, the conduction voltage of the first unidirectional switch 12*a* and the first voltage is greater than the threshold voltage of the second switch element SW2. The first voltage is a floating voltage. The second voltage or the third voltage is equal to the first voltage. In this embodiment, the third voltage is equal to the first voltage. Moreover, the second voltage is a stable voltage.

When the first signal S1 is in the low-voltage level state, the path between the ground terminal G and the output terminal 11 is conducted through the switching circuit 10, and the voltage at the output terminal 11 is equal to zero.

Under this circumstance, the third voltage charges the first capacitor Cdd through the first unidirectional switch 12. Meanwhile, the voltage at the second terminal of the first capacitor Cdd is the third voltage. That is, the voltage at the control terminal Ga of the first switch element SW is the third voltage, and the third voltage is equal to the first voltage. Since the voltage difference between the control terminal Ga and the second power terminal P2 of the first switch element SW is zero and less than the second threshold voltage of the first switch element SW, the first switch element SW is turned off. When the third signal S3 is in the high-voltage level state, the second capacitor CddH is connected with the control terminal Ga1 of the second switch element SW2 through the first driving chip 13*a*. Since the voltage difference between the control terminal Ga1 of the second switch element SW2 and the second power terminal P2*a* of the second switch element SW2 is equal to the second voltage at the first voltage terminal V1, the second switch element SW2 is turned on. When the first signal S1 is in the high-voltage level state, the path between the first voltage terminal V1 and the output terminal 11 is conducted through the switching circuit 10, and the voltage at the output terminal 11 is equal to the second voltage at the first voltage terminal V1. Under this circumstance, the voltage at the second terminal of the first capacitor Cdd rises to the second voltage plus the third voltage. That is, the voltage at the control terminal Ga of the first switch element SW is equal to the second voltage plus the third voltage. Since the result of the second voltage plus the third voltage minus the sum of the conduction voltage of the first unidirectional switch 12 and the first voltage is greater than the first threshold voltage of the first switch element SW, the first switch element SW is turned on. When the third signal S3 is in the low-voltage level state, the control terminal Ga1 of the second switch element SW2 is connected with the second power terminal P2*a* of the second switch element SW2 through the first driving chip 13*a*. Since the voltage difference between the control terminal Ga1 of the second switch element SW2 and the second power terminal P2*a* of the second switch element SW2 is zero, the second switch element SW2 is turned off. Moreover, since the first switch element SW is turned on, the second power terminal P2*a* of the second switch element SW2 is connected with the second power terminal P2 of the first switch element SW. Consequently, the voltage at the second power terminal P2*a* of the second switch element SW2 is equal to the first voltage. The voltage at the second terminal of the first capacitor Cdd is greater than the voltage at the second terminal 123 of the second unidirectional switch 12*b*. The second unidirectional switch 12*b* is turned on. Consequently, the second capacitor CddH is charged until the voltage across its two terminals is equal to the second voltage. As mentioned above, the first voltage at the second power terminal P2 of the first switch element SW is the floating voltage. Under control of the driving circuit 1*f*, the voltage difference between the control terminal Ga and the second power terminal P2 of the first switch element SW is equal to zero or the second voltage. Consequently, even if the first voltage is the floating voltage, the first switch element SW is not influenced by the first voltage. Similarly, the voltage difference between the control terminal Ga1 and the second power terminal P2*a* of the second switch element SW2 is equal to zero or the second voltage. In other words, the switching performance and the reliability of the switch elements will be enhanced.

Figure 8:
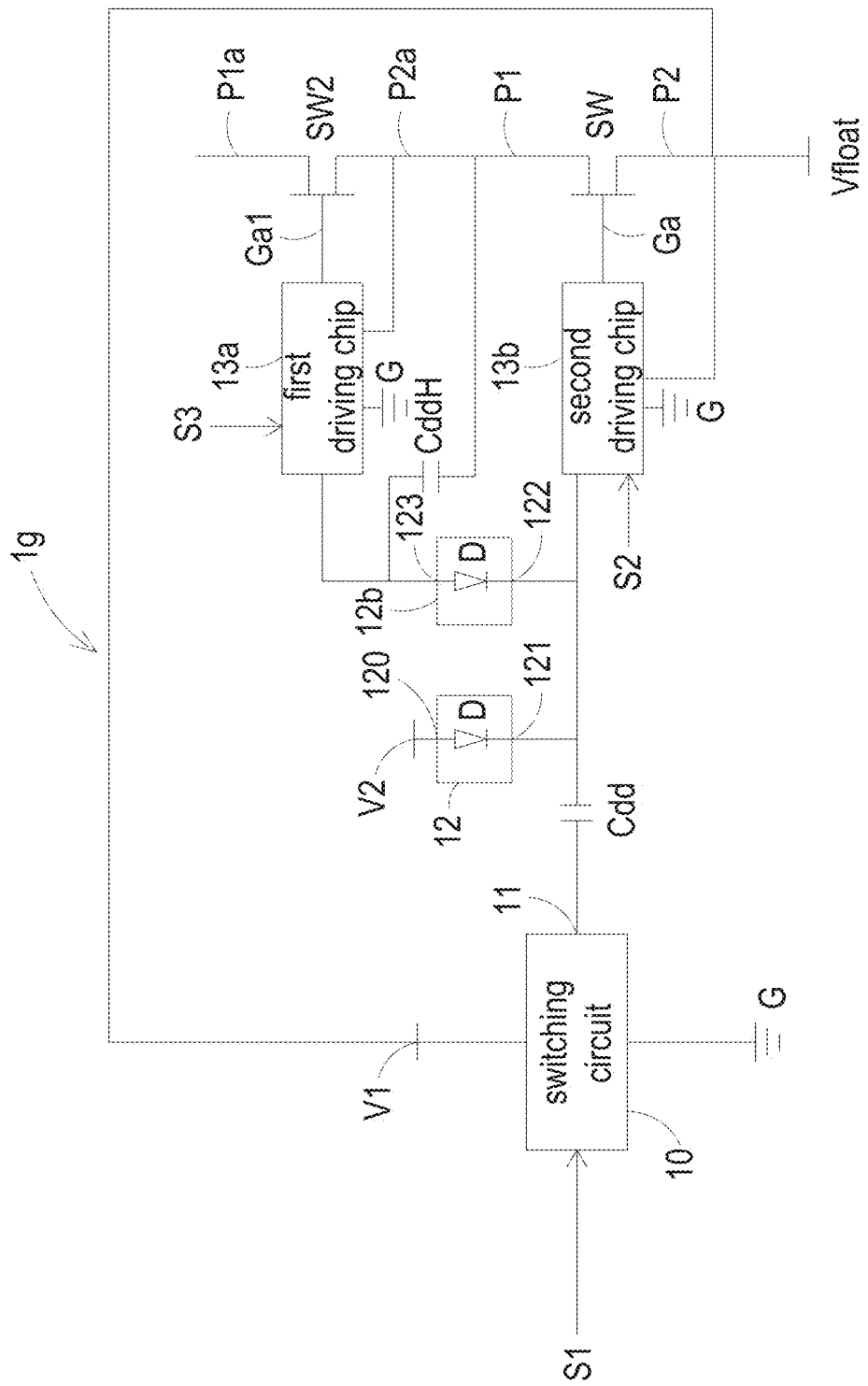
FIG. 8 is a schematic circuit diagram illustrating a driving circuit for driving a switch element according to an eighth embodiment of the present disclosure.

FIG. 8 is a schematic circuit diagram illustrating a driving circuit for driving a switch element according to an eighth embodiment of the present disclosure. In the embodiment, the structures, elements and functions of the driving circuit 1g are similar to those of the driving circuit 1f of FIG. 7, and are not redundantly described herein. In comparison with the driving circuit 1f shown in FIG. 7, the driving circuit 1g of this embodiment further includes a second driving chip 13b. The power supply terminal of the second driving chip 13b is electrically connected with the second terminal of the first capacitor Cdd, the second terminal 121 of the first unidirectional switch 12 and the first terminal 122 of the second unidirectional switch 12b. The output terminal of the second driving chip 13b is electrically connected with the control terminal Ga of the first switch element SW, and the output ground terminal of the second driving chip 13b is electrically connected with the second power terminal P2 of the first switch element SW. The signal ground terminal of the second driving chip 13b is electrically connected with the ground terminal G. The signal terminal of the second driving chip 13b further receives a second signal S2. The second signal S2 is a signal that is switched between a high-voltage level state and a low-voltage level state. For example, the second signal S2 is a pulse width modulation (PWM) signal. The second signal S2 is synchronized with the first signal S1. When the second signal S2 is in the high-voltage level state, the voltage at the control terminal Ga of the first switch element SW is equal to the voltage at the second terminal of the first capacitor Cdd. When the second signal S2 is in the low-voltage level state, the voltage at the control terminal Ga of the first switch element SW is equal to the first voltage at the floating terminal Vfloat. In addition, compared with the second power terminal P2 of the first switch element SW shown in FIG. 7, which is electrically connected to the second voltage terminal V2 and receives the third voltage transmitted from the second voltage terminal V2, in this embodiment, the second power terminal P2 of the first switch element SW is no longer electrically connected to the second voltage terminal V2, but is instead electrically connected to the first voltage terminal V1 and receives the second voltage. Therefore, the second voltage is equal to the first voltage.

In the embodiment, when the first signal S1 and the second signal S2 are both in the low-voltage level state, the path between the ground terminal G and the output terminal 11 is conducted through the switching circuit 10, and the voltage at the output terminal 11 is equal to zero. Under this circumstance, the third voltage charges the first capacitor Cdd through the first unidirectional switch 12. Meanwhile, the voltage at the second terminal of the first capacitor Cdd is the third voltage. Moreover, since the second signal S2 is in the low-voltage level state, the voltage at the control terminal Ga of the first switch element SW is equal to the first voltage at the floating terminal Vfloat. Since the voltage difference between the control terminal Ga and the second power terminal P2 of the first switch element SW is zero and less than the second threshold voltage, the first switch element SW is turned off. When the third signal S3 is in the high-voltage level state, the second capacitor CddH is connected with the control terminal Ga1 of the second switch element SW2 through the first driving chip 13a. Since the voltage difference between the control terminal Ga1 of the second switch element SW2 and the second power terminal P2a of the second switch element SW2 is equal to the second voltage at the first voltage terminal V1, the second switch element SW2 is turned on. When the first signal S1 and the second signal S2 are both in the high-voltage level state, the path between the first voltage terminal V1 and the output terminal 11 is conducted through the switching circuit 10, and the voltage at the output terminal 11 is equal to the second voltage at the first voltage terminal V1. Under this circumstance, the voltage at the second terminal of the first capacitor Cdd rises to the second voltage plus the third voltage. That is, the voltage at the control terminal Ga of the first switch element SW is equal to the second voltage plus the third voltage. Since the result of the second voltage plus the third voltage minus the first voltage is equal to the third voltage, and the third voltage is greater than the first threshold voltage of the first switch element SW, the first switch element SW is turned on. When the third signal S3 is in the low-voltage level state, the control terminal Ga1 of the second switch element SW2 is connected with the second power terminal P2a of the second switch element SW2 through the first driving chip 13a. Since the voltage difference between the control terminal Ga1 of the second switch element SW2 and the second power terminal P2a of the second switch element SW2 is zero, the second switch element SW2 is turned off. Moreover, since the first switch element SW is turned on, the second power terminal P2a of the second switch element SW2 is connected with the second power terminal P2 of the first switch element SW. Consequently, the voltage at the second power terminal P2a of the second switch element SW2 is equal to the first voltage. The voltage at the second terminal of the first capacitor Cdd is greater than the voltage at the second terminal 123 of the second unidirectional switch 12b. The second unidirectional switch 12b is turned on. Consequently, the second capacitor CddH is charged until the voltage across its two terminals is equal to the second voltage. As mentioned above, the first voltage at the second power terminal P2 of the first switch element SW is the floating voltage. Under control of the driving circuit 1g, the voltage difference between the control terminal Ga and the second power terminal P2 of the first switch element SW is equal to zero or the third voltage. Consequently, even if the first voltage is the floating voltage, the first switch element SW is not influenced by the first voltage. Similarly, the voltage difference between the control terminal Ga1 and the second power terminal P2a of the second switch element SW2 is equal to zero or the third voltage. In other words, the switching performance and the reliability of the switch element will be enhanced by the driving circuit 1g. In addition, in order to prevent the first voltage from charging the first capacitor Cdd through the second driving chip 13b, the sum of the first voltage and the conduction voltage of the first unidirectional switch 12 minus the third voltage is less than 0.7V.

In some of the above embodiments, when it is described that the second terminal voltage of the first capacitor Cdd is equal to the third voltage, the conduction voltage of the first unidirectional switch 12 is ignored. In fact, the conduction voltage of the first unidirectional switch 12 exists, and different switches have different conduction voltage drops. The first unidirectional switch 12 can a diode or a switch tube such as a MOS tube or an IGBT, but not limited thereto. Considering the actual situation, when the first unidirectional switch 12 is turned on, the voltage at the second terminal of the first capacitor Cdd is equal to the third voltage minus the conduction voltage of the first unidirectional switch. Similarly, the conduction voltage of the second unidirectional switch 12b also exists when the second unidirectional switch 12b is turned on, and different switches have different conduction voltage drops. The second unidirectional switch 12b can be for example but not limited to a diode, or a switch tube such as a MOS tube or IGBT. Therefore, the conduction voltages of the first unidirectional switch 12 and the second unidirectional switch 12b should be taken into consideration when the relationship between each voltage and the threshold voltage of the first switch element SW and the second switch element SW2 are set.

In the above embodiments, the unidirectional switch can be for example but not limited to a diode, or a three-terminal switch element.

The present disclosure further includes an embodiment. The embodiment is applicable to all of the above-mentioned embodiments. In this embodiment, the first unidirectional switch 12 and the second unidirectional switch 12b are replaced by three-terminal switch devices. By using the three-terminal switch device, it can not only achieve the unidirectional conduction, but also reduce the conduction voltage drop. The three-terminal switch device includes three terminals such as a control terminal, a first power terminal and a second power terminal. Please refer to FIG. 1, the three-terminal switch device performs the unidirectional conduction by the way as follows. The control terminal of the three-terminal switch device receives a control signal. The first power terminal of the three-terminal switch device is electrically connected to the second terminal 121 of the first unidirectional switch 12. The second power terminal of the three-terminal switch device is electrically connected to the first terminal 120 of the first unidirectional switch 12. When the switching circuit 10 is pulled down, the first terminal of the first capacitor Cdd is electrically connected with the ground terminal, the control terminal of the three-terminal switch device receives turning-on signal, and the first power terminal and the second power terminal of the three-terminal switch device are at low resistance state. Consequently, the three-terminal switch device is turned on. The second voltage terminal V2 is electrically connected to the second terminal of the first capacitor Cdd. The third voltage charges the first capacitor Cdd through the three-terminal switch device so that the voltage level of the first capacitor Cdd rises to the third voltage.

When the switching circuit 10 is pulled up, the first terminal of the first capacitor Cdd is electrically connected with the second voltage terminal V2, and the second terminal of the first capacitor Cdd rises to the second voltage plus the third voltage. The control terminal of the three-terminal switch device receives turning-off signal, and the first power terminal and the second power terminal of the three-terminal switch device are at high resistance state. Consequently, the three-terminal switch device is turned off. The voltage at second terminal of the first capacitor Cdd relative to the high voltage of the second voltage terminal V2 is blocked by the three-terminal switch device. Consequently, the unidirectional conduction is performed. In addition, when the three-terminal switch device is turned on, the conduction voltage drop is lower than the voltage drop of the unidirectional conduction so that the loss is reduced.

From the above descriptions, the present disclosure provides a driving circuit. Under control of the driving circuit, the voltage difference between the control terminal of the switch element and the second power terminal of the switch element is equal to zero or the second voltage. Consequently, even if the first voltage is the floating voltage, the switch element is not influenced by the first voltage. In other words, the switching performance and the reliability of the switch element will be enhanced by the driving circuit.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit electrically connected with at least one switch element to drive operations of the at least one switch element, each of the at least one switch element comprising a control terminal, a first power terminal and a second power terminal, the at least one switch element comprising a first switch element, the second power terminal of the first switch element receiving a first voltage, the driving circuit comprising:
   a switching circuit receiving a first signal, wherein the switching circuit is electrically connected with a first voltage terminal and a ground terminal, and the switching circuit comprises an output terminal, wherein the first signal is switched between a high-voltage level state and a low-voltage level state, the first voltage terminal receives a second voltage, and a voltage at the output terminal of the switching circuit is switched between the second voltage and a voltage at the ground terminal according to the first signal;
   a first unidirectional switch comprising a first terminal and a second terminal, wherein the first terminal of the first unidirectional switch is electrically connected to a second voltage terminal to receive a third voltage; and
   a first capacitor, wherein a first terminal of the first capacitor is electrically connected with the output terminal of the switching circuit, and a second terminal of the first capacitor is electrically connected with the second terminal of the first unidirectional switch and the control terminal of the first switch element,
   wherein the first voltage is a floating voltage, a result of the second voltage plus the third voltage minus a sum of a conduction voltage of the first unidirectional switch and the first voltage is greater than a first threshold voltage of the first switch element,
   wherein the first capacitor has a capacitance value, and the first capacitor has a charge during a charging-discharging process, wherein a ratio of the charge to the capacitance value satisfies an equation of:

$$\frac{Q_g}{C_{dd}} < \frac{V_1 + V_2 - V_{float}}{20}$$

wherein $Q_g$ is the charge, $C_{dd}$ is the capacitance value, $V_1$ is the second voltage, $V_2$ is the third voltage, and $V_{float}$ is the first voltage.

2. The driving circuit according to claim 1, wherein each of the at least one switch element is a metal-oxide-semiconductor field-effect transistor, an insulated gate bipolar transistor or a SiC power switch.

3. The driving circuit according to claim 1, wherein the first unidirectional switch comprises a first diode, wherein an anode of the first diode is the first terminal of the first unidirectional switch, and a cathode of the first diode is the second terminal of the first unidirectional switch.

4. The driving circuit according to claim 1, wherein third voltage is equal to the first voltage, and the second voltage is a stable voltage.

5. The driving circuit according to claim 1, wherein when the first signal is in the high-voltage level state, a path between the first voltage terminal and the output terminal of the switching circuit is conducted through the switching circuit, and the voltage at the output terminal of the switching circuit is equal to a second voltage, wherein when the first signal is in the low-voltage level state, a path between the ground terminal and the output terminal of the switching circuit is conducted through the switching circuit.

6. The driving circuit according to claim 5, wherein the driving circuit further comprises a driving chip, wherein the driving chip comprises a power supply terminal electrically connected to the second terminal of the first capacitor and the second terminal of the first unidirectional switch, an output terminal electrically connected to the control terminal of the first switch element, an output ground terminal electrically connected to the second power terminal, a signal ground terminal electrically connected to the ground terminal, and a signal terminal receiving a second signal, wherein the second signal is switched between the high-voltage level state and the low-voltage level state, and the second signal is synchronized with the first signal.

7. The driving circuit according to claim 1, wherein the second voltage terminal and the second power terminal are electrically connected.

8. The driving circuit according to claim 1, wherein the driving circuit further comprises a driving chip, wherein a power supply terminal of the driving chip is electrically connected with the second terminal of the first capacitor and the second terminal of the first unidirectional switch, wherein an output terminal of the driving chip is electrically connected to the control terminal of the first switch element, an output ground terminal of the driving chip is electrically connected to the second power terminal of the first switch element and the ground terminal, a signal ground terminal of the driving chip is electrically connected to the ground terminal, and a signal terminal of the driving chip receives a second signal, wherein the second signal is switched between the high-voltage level state and the low-voltage level state, and the second signal is synchronized with the first signal, wherein the first voltage terminal and the second power terminal are electrically connected.

9. The driving circuit according to claim 8, wherein the second voltage is equal to the first voltage.

10. The driving circuit according to claim 8, wherein the driving circuit further comprises a second unidirectional switch, the second unidirectional switch comprises a first terminal and a second terminal, the first terminal of the second unidirectional switch is electrically connected with the second terminal of the first capacitor, and the second terminal of the second unidirectional switch is electrically connected with a power supply terminal of the driving chip.

11. The driving circuit according to claim 10, wherein the second unidirectional switch comprises a second diode, wherein an anode of the second diode is the first terminal of the second unidirectional switch, and a cathode of the second diode is the second terminal of the second unidirectional switch.

12. The driving circuit according to claim 1, wherein driving circuit further comprises a resistor, the resistor is electrically connected in parallel with the first capacitor, and a product of a resistance value of the resistor and a capacitance value of the first capacitor is greater than fifty times of a switching period of the first switch element.

13. The driving circuit according to claim 1, wherein the at least one switch element further comprises a second switch element, wherein the first switch element and the second switch element are connected with each other in series and collaboratively formed as a half-bridge switching circuit, and a second power terminal of the second switch element is electrically connected with the first power terminal of the first switch element.

14. The driving circuit according to claim 13, wherein the driving circuit further comprises a second unidirectional switch, a second capacitor and a first driving chip, wherein the second unidirectional switch comprises a first terminal and a second terminal, a first terminal of the second capacitor is electrically connected with the second terminal of the second unidirectional switch and an power supply terminal of the first driving chip, a second terminal of the second capacitor is electrically connected with an output ground terminal of the first driving chip, the first power terminal of the first switch element and the second power terminal of the second switch element, an output terminal of the first driving chip is electrically connected the control terminal of the second switch element, a signal ground terminal of the first driving chip is electrically connected with the ground terminal, and a signal terminal of the first driving chip receives a third signal, wherein the third signal is switched between the high-voltage level state and the low-voltage level state, wherein the third signal and the first signal are complementarity.

15. The driving circuit according to claim 14, wherein the second voltage terminal is electrically connected to the second power terminal of the first switch element.

16. The driving circuit according to claim 14, wherein the driving circuit further comprises a second driving chip, wherein the second driving chip comprises a power supply terminal electrically connected with the second terminal of the first capacitor, the second terminal of the first unidirectional switch and the first terminal of the second unidirectional switch, and an output terminal electrically connected with the control terminal of the first switch element, an output ground terminal electrically connected with the second power terminal of the first switch element, a signal ground terminal electrically connected with the ground terminal, and a signal terminal receiving a second signal, wherein the second signal is switched between the high-voltage level state and the low-voltage level state, and the second signal is synchronized with the first signal.

17. The driving circuit according to claim 16, wherein the first voltage terminal and the second power terminal of the first switch element are electrically connected.

18. The driving circuit according to claim 14, wherein the sum of the first voltage and the conduction voltage of the first unidirectional switch minus the third voltage is less than 0.7V.

19. The driving circuit according to claim 1, wherein a result of the third voltage minus the sum of the conduction voltage of the first unidirectional switch and the first voltage is less than the second threshold voltage of the first switch element.

20. A driving circuit electrically connected with at least one switch element to drive operations of the at least one switch element, each of the at least one switch element comprising a control terminal, a first power terminal and a second power terminal, the at least one switch element comprising a first switch element, the second power terminal of the first switch element receiving a first voltage, the driving circuit comprising:

a switching circuit receiving a first signal, wherein the switching circuit is electrically connected with a first voltage terminal and a ground terminal, and the switching circuit comprises an output terminal, wherein the first signal is switched between a high-voltage level state and a low-voltage level state, the first voltage terminal receives a second voltage, and a voltage at the output terminal of the switching circuit is switched between the second voltage and a voltage at the ground terminal according to the first signal;
a first unidirectional switch comprising a first terminal and a second terminal, wherein the first terminal of the first unidirectional switch is electrically connected to a second voltage terminal to receive a third voltage; and
a first capacitor, wherein a first terminal of the first capacitor is electrically connected with the output terminal of the switching circuit, and a second terminal of the first capacitor is electrically connected with the second terminal of the first unidirectional switch and the control terminal of the first switch element,
wherein the first voltage is a floating voltage, a result of the second voltage plus the third voltage minus a sum of a conduction voltage of the first unidirectional switch and the first voltage is greater than a first threshold voltage of the first switch element,
wherein the first threshold voltage of the first switch element is a stable voltage when the first signal is switched to the high-voltage level state or the low-voltage level state.

21. The driving circuit according to claim 20, wherein the driving circuit further comprises a resistor, the resistor is electrically connected in parallel with the first capacitor, and a product of a resistance value of the resistor and a capacitance value of the first capacitor is greater than fifty times of a switching period of the first switch element.

\* \* \* \* \*